United States Patent [19]

Parat et al.

[11] Patent Number: 5,763,912
[45] Date of Patent: Jun. 9, 1998

[54] DEPLETION AND ENHANCEMENT MOSFETS WITH ELECTRICALLY TRIMMABLE THRESHOLD VOLTAGES

[75] Inventors: Krishna K. Parat, Palo Alto; Gregory E. Atwood, San Jose, both of Calif.

[73] Assignee: Intel Corporation, Santa Clara, Calif.

[21] Appl. No.: 533,404

[22] Filed: Sep. 25, 1995

[51] Int. Cl.$^6$ .................. H01L 29/788; H01L 29/792; H01L 29/76; H01L 29/94
[52] U.S. Cl. .................. 257/315; 257/316; 257/321; 257/326; 257/391; 257/392
[58] Field of Search .................. 257/315, 316, 257/314, 321, 326, 391, 392

[56] References Cited

U.S. PATENT DOCUMENTS 4,590,504  5/1986  Guterman .................. 257/315

*Primary Examiner*—Steven H. Loke
*Attorney, Agent, or Firm*—Blakely, Sokoloff, Taylor & Zafman

[57] ABSTRACT

A switching device having an electrically trimmable threshold voltage comprises a control transistor having favorable programming and erasing characteristics and a sensing transistor suited for stability and high drain voltages. The control transistor includes a floating gate for storing a charge. The control transistor receives an input voltage to vary the charge. The sensing transistor, which has a threshold voltage, includes the floating gate, which is formed from a single, contiguous layer of polysilicon or from separate polysilicon layers connected by metallization, such that the floating gate is shared by the control transistor and the sensing transistor. The control transistor has a tunnel oxide layer between a semiconductor layer and the floating gate having a thickness that is conducive to injection or tunneling of electrons through the tunnel oxide layer. The sensing transistor has a gate oxide layer between the semiconductor layer and the floating gate having a thickness greater than the thickness of the tunnel oxide layer, such as to substantially inhibit injection or tunneling of electrons through the gate oxide layer. Applying the input voltage to the control transistor varies the charge on the floating gate and thereby changes the threshold voltage of the sensing transistor.

20 Claims, 12 Drawing Sheets

DEPLETION AND ENHANCEMENT MOSFETS WITH ELECTRICALLY TRIMMABLE THRESHOLD VOLTAGES

FIELD OF THE INVENTION

The present invention pertains to the field of semiconductor devices. More particularly, the present invention relates to MOSFETS having electrically trimmable threshold voltages.

BACKGROUND OF THE INVENTION

Most metal-oxide-semiconductor field effect transistors (MOSFETs) have a certain "threshold voltage", which is the gate-to-source voltage at which a channel is created and a current flows between the drain and the source. The threshold voltage is essentially the "turn on" voltage of the MOSFET. Certain semiconductor devices are constructed with threshold voltages that are trimmable (adjustable). There are many reasons why it is advantageous to have a device with a trimmable threshold voltage. For example, trimmable threshold devices are commonly used as data storage (memory) devices. In addition, a trimmable threshold voltage may be useful in improving temperature and voltage sensitivity in certain MOSFET circuits. In particular, a MOSFET generally has a gate voltage at which the drain current is least sensitive to temperature; if the threshold voltage can be set so that, under a grounded gate condition, the MOSFET is at optimum gate bias with respect to the drain current temperature sensitivity, then gate voltage or temperature dependencies in the overall circuit can be simultaneously reduced.

The threshold voltage of a MOSFET can be set during the manufacturing process using techniques such as ion implantation. However, it is desirable to have a device with a threshold voltage that is trimmable even after the device has been manufactured, e.g., during testing. Flash memory cells and electrically erasable programmable read-only memory (EEPROM) cells are examples of such devices. Flash cells and EEPROM cells generally have electrically trimmable threshold voltages. In a Flash cell, an example of which is illustrated in FIG. 1B, a floating polysilicon (Poly 1) gate 130 and a relatively thin tunnel oxide 140 between the floating gate 130 and the substrate allow raising or lowering of the threshold voltage by "programming" or "erasing" the cell, respectively. Programming is the storing of a charge on the floating gate 130, which is accomplished by "hot electron" injection, i.e., injection of electrons from the drain 120 to the floating gate 130. Electrons are injected onto the floating gate 130 by applying a positive voltage to the (Poly 2) control gate 150 and to the drain 120. Electron injection may be accomplished by holding the control gate 150 at 12 V while the drain 120 is held at 6 V. Erasing is accomplished by Fowler-Nordheim (or "cold electron") tunneling of electrons from the floating gate 130 to the source 110. Fowler-Nordheim tunneling can be accomplished by applying, for example, 12 V to the source 110, or by applying 5 V to the source 110 and −10 V to the control gate 150. EEPROM devices are generally both programmed and erased by Fowler-Nordheim tunneling.

Certain circuit applications, however, require transistors that are particularly stable or which can tolerate particularly high voltages, or both. For example, voltage regulators generally include voltage reference circuits. MOSFETs used within some voltage reference circuits must be very stable at drain voltages on the order of 12 V. Although Flash and EEPROM cells provide the advantage of an electrically trimmable threshold voltage, they are generally not well-suited to high-voltage/high-stability applications, such as voltage reference circuits. In particular, Flash and EEPROM cells are often sensitive to a number of fault conditions, including soft-erase and data disturbs.

On the other hand, the high-voltage MOSFETs which are generally used in voltage reference circuits are not constructed with floating gates, as are Flash and EEPROM cells. (A high-voltage MOSFET is illustrated in FIG. 2B.) Consequently, such devices cannot be programmed or erased to vary their threshold voltages. Moreover, such devices are constructed with very thick gate oxides (e.g., over 300 Å) in order to provide high-voltage tolerance, which effectively prevents injection or tunneling of electrons. Hence, it is desirable to provide a stable, high-voltage tolerant MOSFET having an electrically trimmable threshold voltage. It is further desirable to be able to fabricate such a device using existing fabrication techniques and without adding additional steps to current fabrication processes.

SUMMARY OF THE INVENTION

A switching device having an electrically trimmable threshold voltage comprises a control transistor and a sensing transistor. The control transistor includes a floating gate for storing a charge. The control transistor receives an input voltage to vary the charge. The sensing transistor, which has a threshold voltage, includes the floating gate, such that the floating gate is shared by the control transistor and the sensing transistor, such that varying the charge causes a change in the threshold voltage.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A stable, high-voltage tolerant MOSFET having an electrically trimmable threshold voltage is described. In the following description, for purposes of explanation, numerous specific details are set forth in order to provide a thorough understanding of the present invention. It will be evident, however, to one skilled in the art that the present invention may be practiced without these specific details. In other instances, well-known structures and devices are shown in symbolic form in order to avoid unnecessarily obscuring the present invention.

Figure 1A:
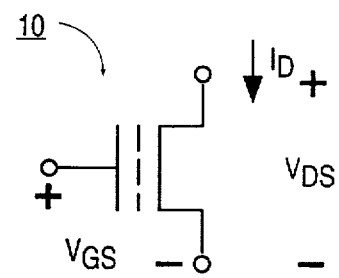
FIGS. 1A through 1C illustrate a Flash memory cell.
Figure 1B:
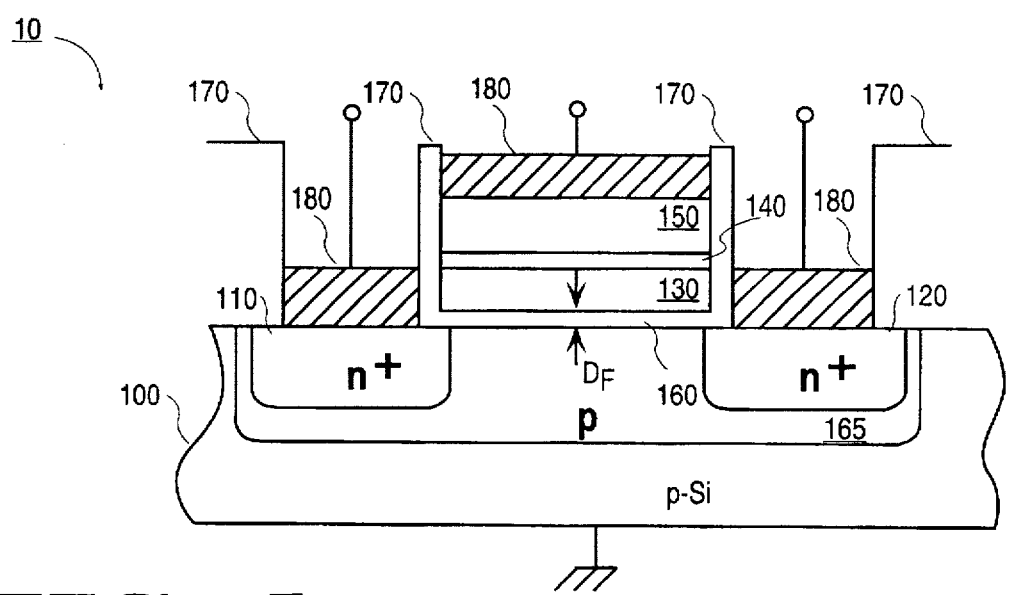
Figure 1C:
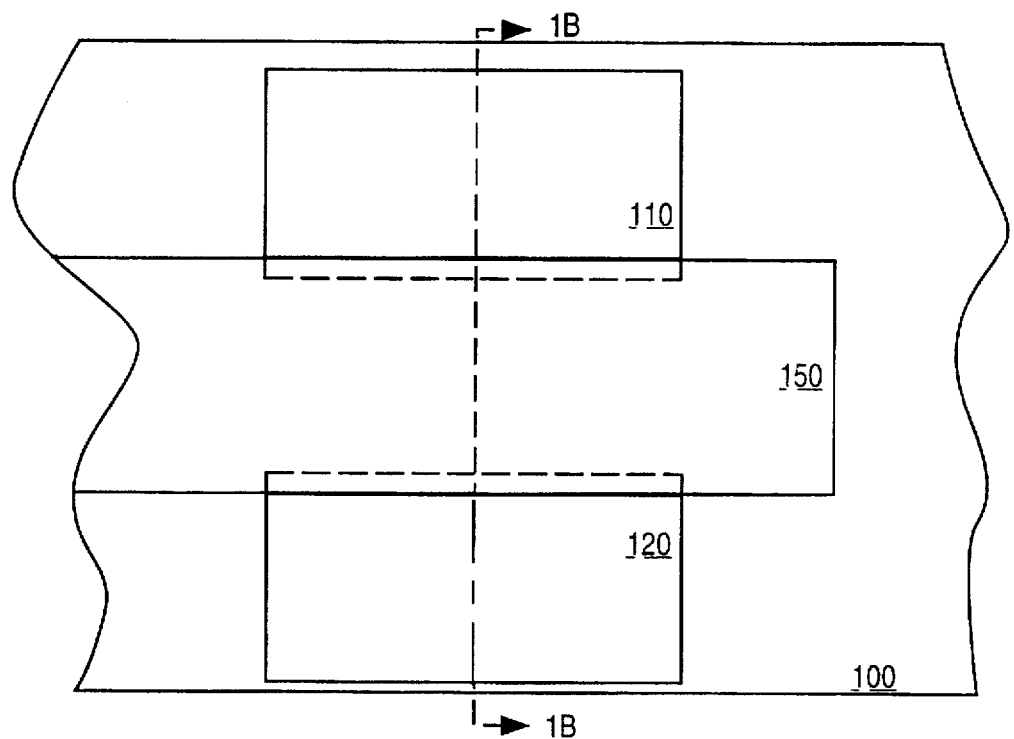

FIGS. 1A, 1B and 1C illustrate a Flash Memory cell 10. The Flash cell 10 has a certain threshold voltage. Referring to FIG. 1A, the current $I_D$ flows when both the drain-to-source voltage $V_{DS}$ is present and the gate-to-source voltage $V_{GS}$ of the Flash cell 10 exceeds the threshold voltage. FIG. 1B shows a cross-sectional view of the Flash cell 10. An $n^+$-doped source 110 and an $n^+$-doped drain 120 are formed in a p-type well 165, which is formed in a p-type silicon substrate 100. The Flash cell 10 has a floating gate 130 formed from a first polysilicon layer (Poly 1). The Flash cell 10 also has a control gate 150 formed from a second polysilicon layer (Poly 2). Alternatively, the control gate 150 may be formed from the combination of the Poly 2 layer and a layer of tungsten silicide ($WSi_2$) formed over the Poly 2 layer. The floating gate 130 and the control gate 150 are separated by a layer of oxide-nitride-oxide (ONO) 140. A tunnel oxide layer 160 formed from thermally grown silicon dioxide ($SiO_2$) isolates the floating gate 130 from the substrate 100. The tunnel oxide 160 has a thickness $D_F$ of approximately 100 Å, which permits programming and erasing of the Flash cell 10 by hot electron injection and Fowler-Nordheim tunneling, respectively. Contacts are made to the source 110, drain 120, and control gate 150 by metallization (e.g., aluminum) layers 180. Isolation is provided by $SiO_2$ 170. FIG. 1C provides a top view of the Flash cell 10. It will be understood that line 1B—1B in FIG. 1C represents the approximate location of the cross-section shown in FIG. 1B. (Note that FIGS. 1B and 1C are not drawn to the same scale. Some features are shown enlarged to facilitate understanding. In addition, the floating gate 130 and the ONO layer 140 are not visible in FIG. 1C, as these layers are co-extensive with the control gate 150 when viewed from above. Field oxide 170 and metallization layers 180 are not shown in FIG. 1C in order to provide clarity.)

Figure 2A:
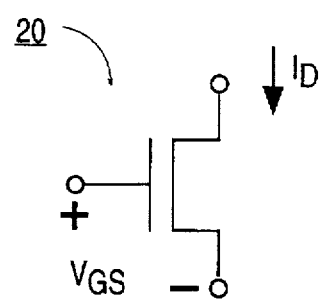
FIGS. 2A through 2D illustrate n- and p-channel MOSFETs produced during the Flash fabrication process for providing stable, high-voltage characteristics.
Figure 2B:
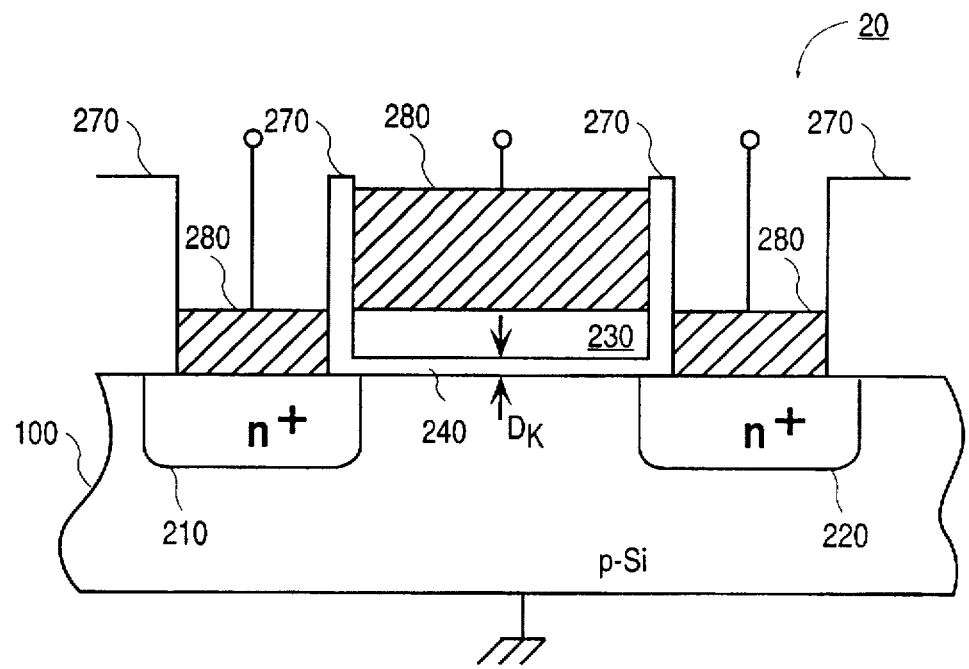
Figure 2C:
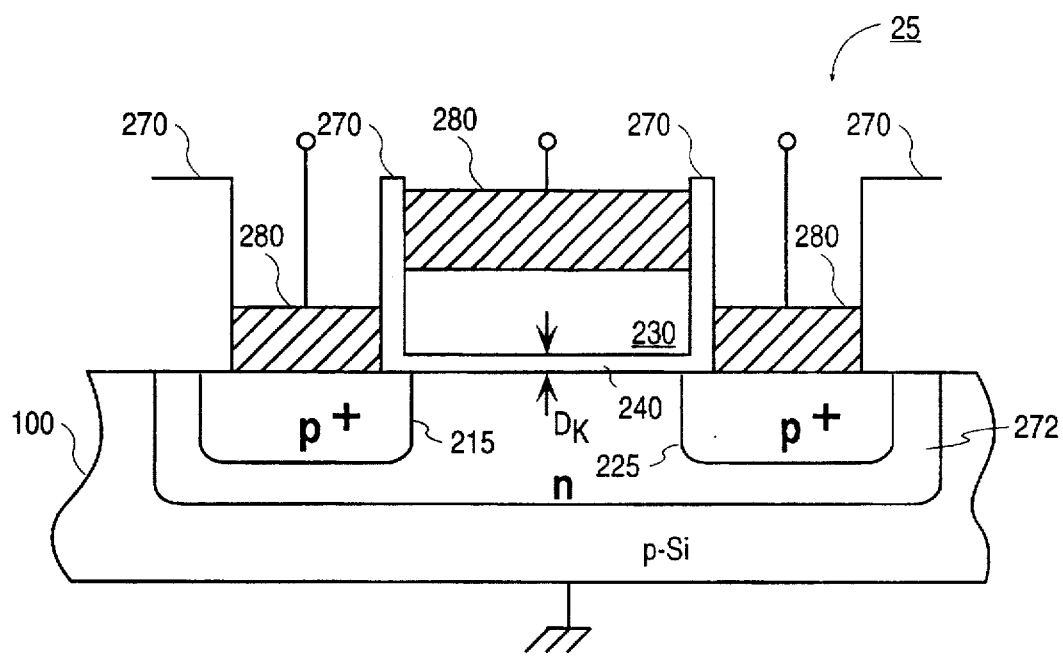
Figure 2D:
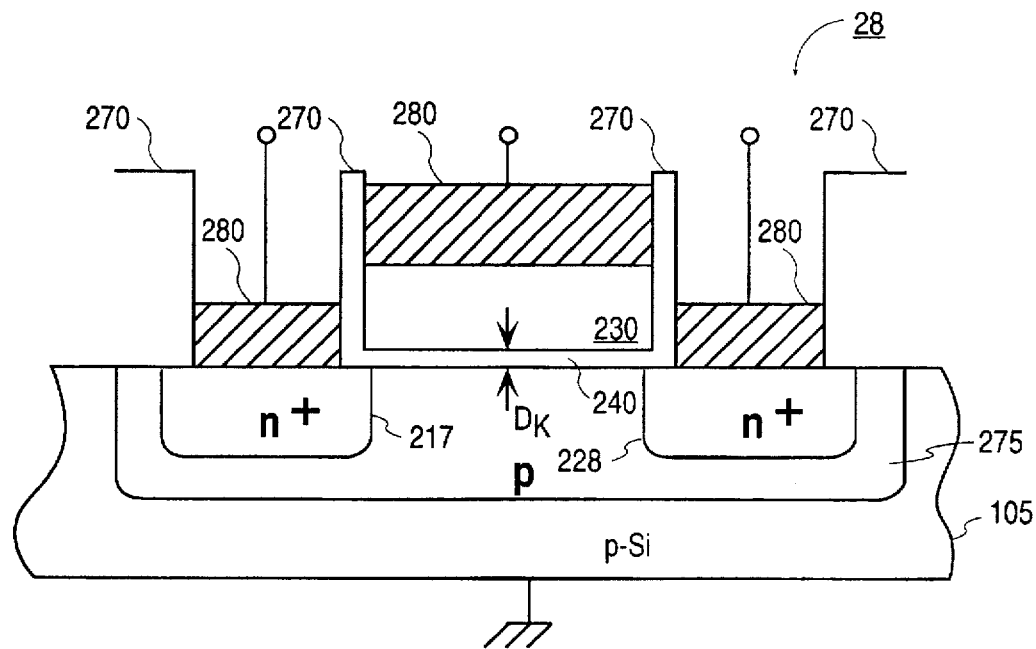

The Flash fabrication process also supports the fabrication of several special-purpose MOSFETs, which are illustrated in FIGS. 2A through 2D, on the same chip as the Flash memory cell 10. The devices illustrated in FIGS. 2A through 2D are designed for stability and high drain voltages, such as may be encountered in certain voltage reference circuits. These devices can be fabricated using the existing Flash process without any additional fabrication steps, as long as the devices are subject to the appropriate masking steps. The first such device is an n-channel MOSFET designated a "K device", which is illustrated in FIGS. 2A and 2B. The K device 20 is formed on the p-type substrate 100 without the addition of any well or threshold adjustment implant. The K device 20 has a positive threshold voltage and is an enhancement mode device. FIG. 2C shows an "O device" 25, which is a p-channel variation of the K device 20 formed in the n-well 272. The O device 25 has a negative threshold voltage and is an enhancement mode device. The source 215 and drain 225 of the O device 25 are $p^+$ regions formed within the n-well 272. The n-well 272 is formed in the p-type substrate 100. FIG. 2D shows an "M device" 28, which is an n-channel variation of the K device 20. The M device 28 has n+ source and drain regions 217 and 228, respectively, formed within a p-well 275. The p-well 275 is formed in a p-type silicon substrate 105. The M device 28 has a positive threshold voltage and is an enhancement mode device.

The K device 20 has a construction which is representative of the O device 25 and the M device 28 for purposes of this description. Referring now to FIG. 2B, therefore, the K device 20 is controlled by a control gate 230 formed from the same Poly 1 layer as the floating gate 130 of the Flash cell 10. Unlike the Flash cell 10, however, the metallization layer 280 is contacted directly to the Poly 1 layer 230 in the K cell 20. Also, there is no inter-Poly ONO layer in the K device 20, since contact is made directly to the Poly 1 control gate 230. The K device 20 has a gate oxide 240 which has a thickness $D_K$ of approximately 340 Å. The relatively large thickness $D_K$ of the gate oxide 240 and relatively low channel doping support high drain voltages (e.g. of approximately 12 volts) and give the K device 20 stability, although these features also make hot electron injection and Fowler-Nordheim tunneling impractical. Consequently, the threshold voltages of the K device 20, the O device 25, and the M device 28 are not electrically trimmable for practical purposes. However, these devices can be modified in accordance with the present invention to create a new device which has the stability and high-voltage tolerance of these devices and which does have an electrically trimmable threshold voltage, as will now be described.

The present invention includes devices designated as a K-Flash Cell (KFC), an O-Flash Cell (OFC), and an M-Flash Cell (MFC). The KFC comprises a Flash cell, which is well-suited for programming and erasing, and a modified K device, which is well-suited for stability and high drain voltages. Similarly, the OFC comprises a Flash cell and a modified O device, and the MFC comprises a Flash cell and a modified M device, each constructed as will be described below. To avoid confusion, this description will focus primarily on the K device and the KFC, although it should be appreciated that an O device or an M device may easily be substituted for the K device 305 to produce an OFC or an MFC, respectively.

Figure 3A:
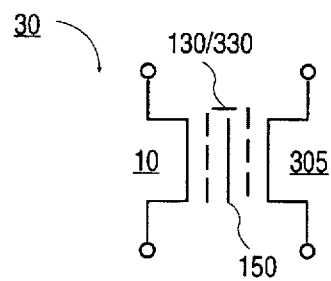
FIG. 3A through 3C illustrate a K-Flash cell (KFC) in accordance with the present invention.
Figure 3B:
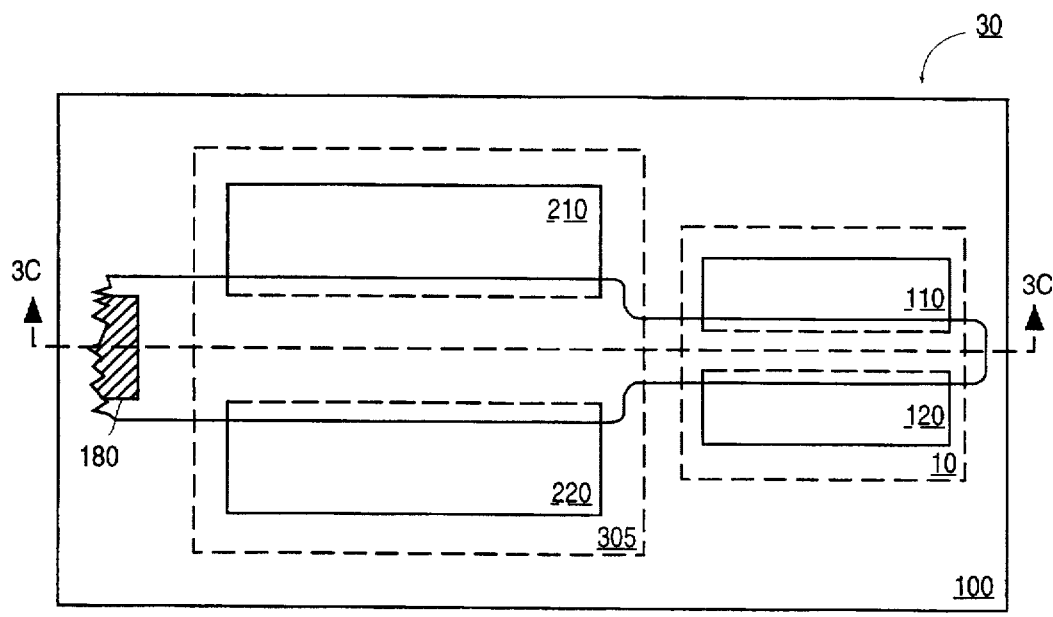
Figure 3C:
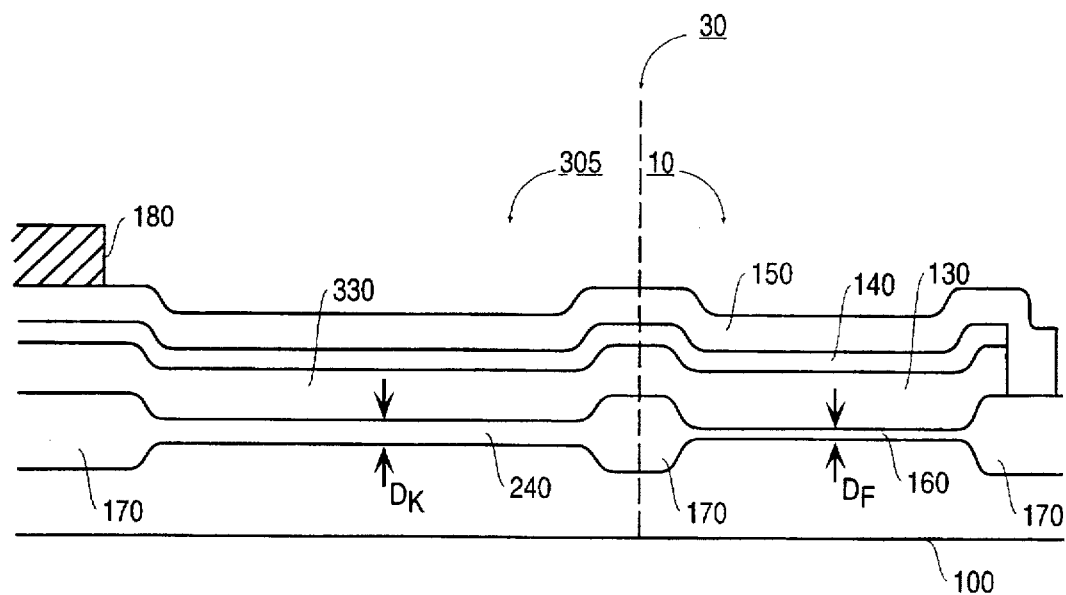

A KFC 30 is illustrated in FIG. 3A, 3B and 3C. As shown symbolically in FIG. 3A, the KFC 30 comprises the Flash cell 10 and a modified K device 305. FIG. 3B shows a top view of KFC 30 (oxide layers not shown), while FIG. 3C shows a cross-sectional view of the KFC 30. It will be understood that line 3C—3C in FIG. 3B represents the approximate location of the cross-section shown in FIG. 3C. (Note that FIGS. 3B and 3C are not drawn to the same scale. Some features are shown enlarged to facilitate understanding.) The K device 305 has an intrinsic (untrimmed) threshold voltage $V_{TK}$ which is distinct from the threshold voltage of the Flash cell 10. The K device 305 has essentially the same physical characteristics as the standard K device 20, i.e., a gate oxide 240 approximately 340 Å thick, an $n^+$ source 210 and an $n^+$ drain 220. Therefore, like the standard K device 20, K device 305 can also support high drain voltages (e.g., of approximately 12 volts). However, unlike the standard K device 20, K device 305 has a floating gate 330. Further, the floating gate 330 of the K device 305 is physically shared by the Flash cell 10. That is, the floating gate 130 of the Flash cell 10 and the floating gate 330 of the K device 305 are actually a single floating gate 130/330 formed from one contiguous layer of polysilicon (the Poly 1 layer). The Flash cell 10 and K device 305 also share a common control gate 150 formed from the Poly 2 layer and a common ONO layer 140. Thus, the gate of the K cell 305 consists of a Poly 1/ONO/Poly 2 stack which is patterned together with the gate of the Flash cell 10 during SAMOS etch. Gate contact to the K device 305 is made through metallization 180 contacting the shared Poly 2 control gate 150.

By fabricating the K device 305 with a floating Poly 1 gate that is shared with the Flash cell 10, the threshold voltage of the K device 305 becomes electrically trimmable. The threshold voltage of the Flash cell is trimmed in the same manner as described above, i.e., by injection or tunneling of electrons through the thin tunnel oxide layer 160 to program or erase the Flash cell 10. However, because the Flash cell 10 and K device 305 now share the same floating gate 130/330, an increase or decrease in the threshold voltage of the Flash cell 10 will cause an increase or decrease, respectively, in the threshold voltage of the K cell 305.

The KFC, the OFC, and the MFC can be fabricated using the existing Flash process without any additional fabrication steps, as long as the devices are subject to the appropriate masking steps. The Flash cell 10 functions as a control device for adjusting the threshold voltage of the K cell 305. The K cell 305 is a sensing device, in that it "senses" the charge stored on the shared floating gate K device 305, such that the threshold voltage $V_{TK}$ of the K device 305 is responsive to that charge.

Figure 4A:
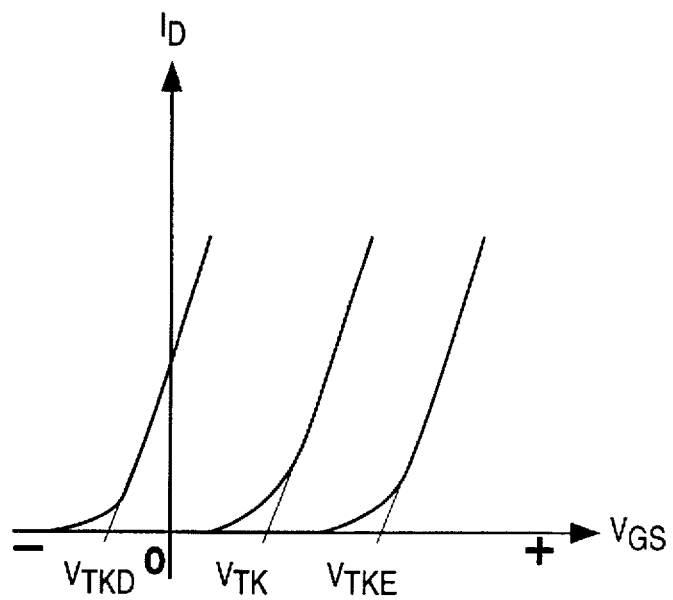
FIG. 4A illustrates an I–V curve of a K portion of a KFC.
Figure 4B:
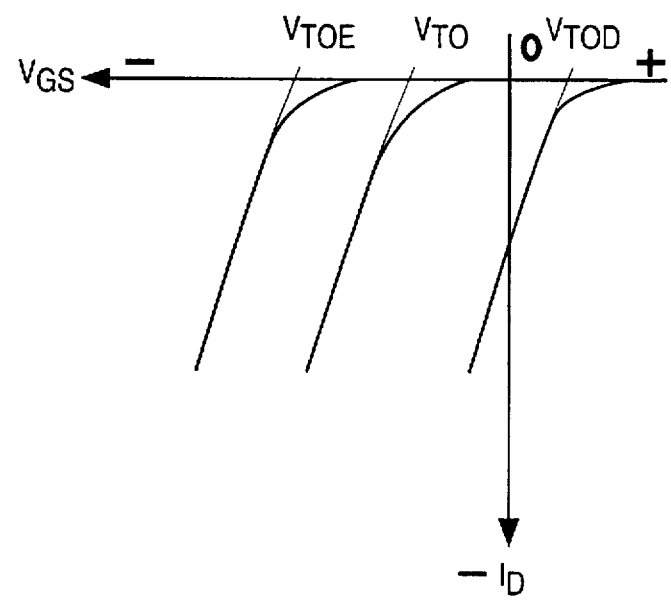
FIG. 4B illustrates an I–V curve of an O portion of an O-Flash cell (OFC).

FIGS. 4A and 4B show the I-V characteristics of the K portion of a KFC cell and an O portion of an OFC cell, respectively. Referring to FIG. 4A, an n-channel K device (or M device) constructed in accordance with the present invention can be made into a depletion device by erasing the Flash cell 10 to the extent that the threshold voltage of the K (or M) device is reduced to a negative voltage $V_{TKD}$. Similarly, a p-channel O-device can be made into a depletion device by programming the Flash cell 10 to the extent that the threshold voltage of the O device is raised above its intrinsic value $V_{TO}$ to a positive voltage $V_{TOD}$, as shown in FIG. 4B. While a depletion device may be desired, however, the present invention permits both lowering and raising of threshold voltages in each of the K, O, and M devices; this property is reflected in the values $V_{TKE}$ and $V_{TOE}$ in FIGS. 4A and 4B.

Figure 5A:
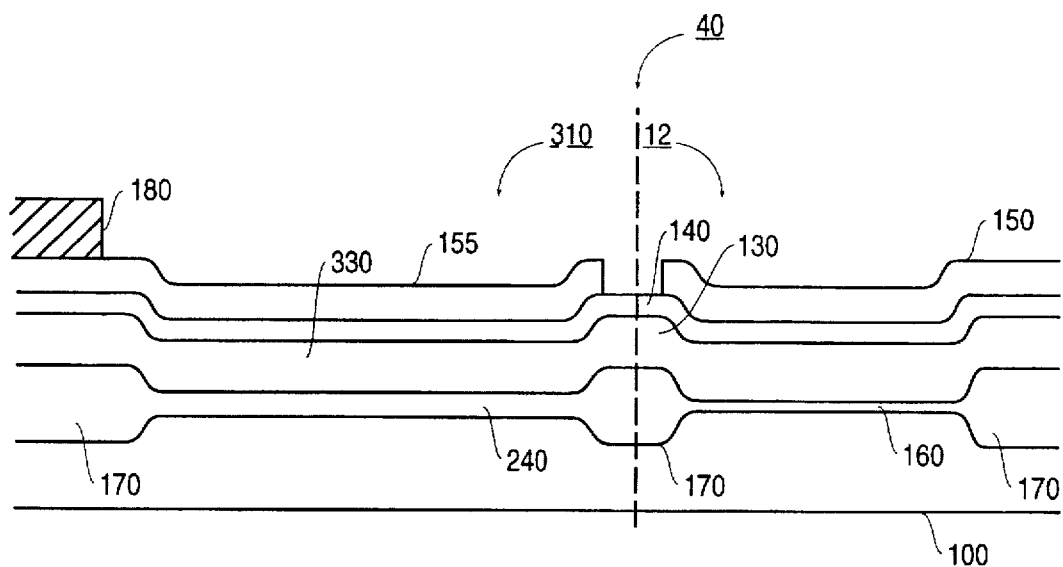
FIG. 5A illustrates an embodiment of a KFC in which the K cell and the Flash cell have separate Poly 2 control gates.
Figure 5B:
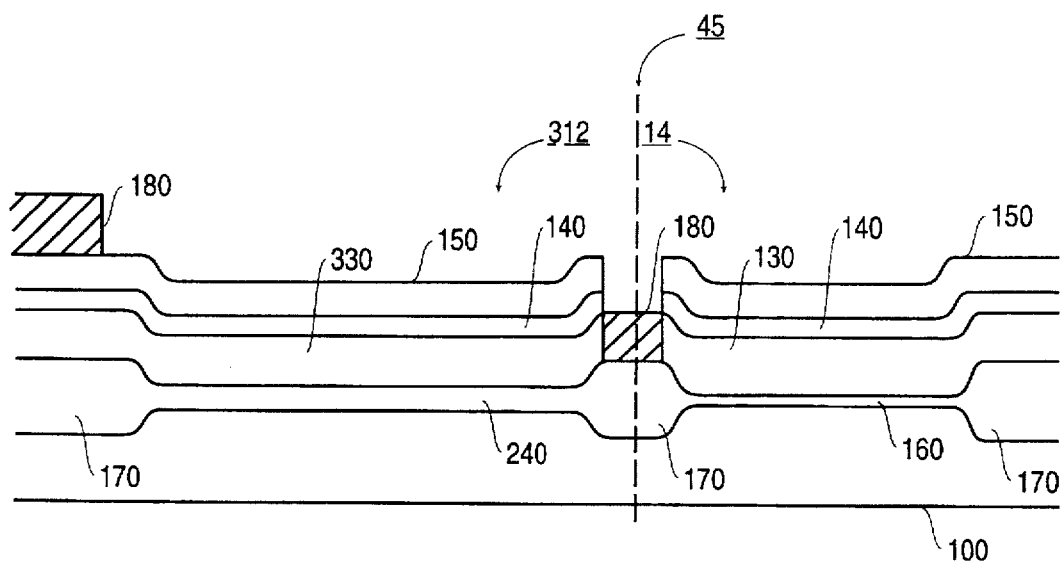
FIG. 5B illustrates an embodiment of a KFC in which the K cell and the Flash cell have separate Poly 2 control gates and a common floating gate formed from two noncontiguous portions of a Poly 1 layer.

FIGS. 5A and 5B show alternative embodiments of the present invention. As shown in FIG. 5A, the present invention does not require that the modified K cell share its control gate with a Flash cell. FIG. 5A shows a KFC 40 comprising a Flash cell 12 and a K cell 310. In FIG. 5A, K cell 310 has a control gate 155 which is formed from the same Poly 2 layer as the control gate of the Flash cell 40 but which is not common with the control gate of the Flash cell 12. The floating gate 130/330 is, however, shared by the Flash cell 12 and the K cell 310. FIG. 5B shows a KFC 45 in which a K cell 312 and a Flash cell 14 have a common floating gate 130/330 formed from two non-contiguous portions of the Poly 1 layer coupled by metallization 180, rather than from a single contiguous layer of the Poly 1.

Figure 6A:
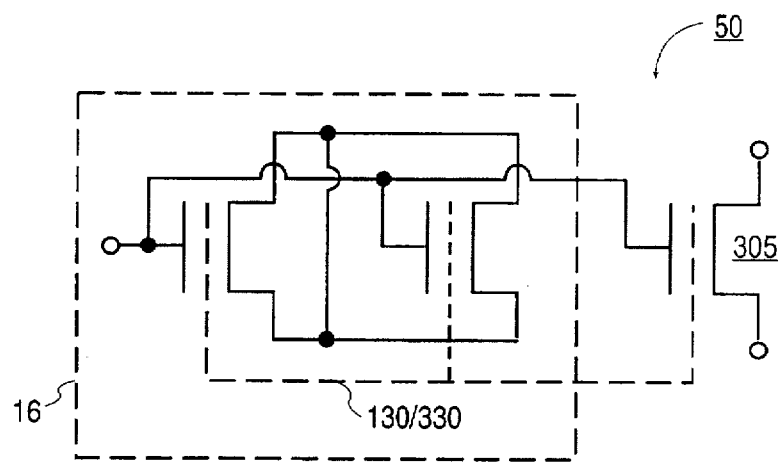
FIGS. 6A and 6B illustrate an embodiment of an erasable KFC.
Figure 6B:
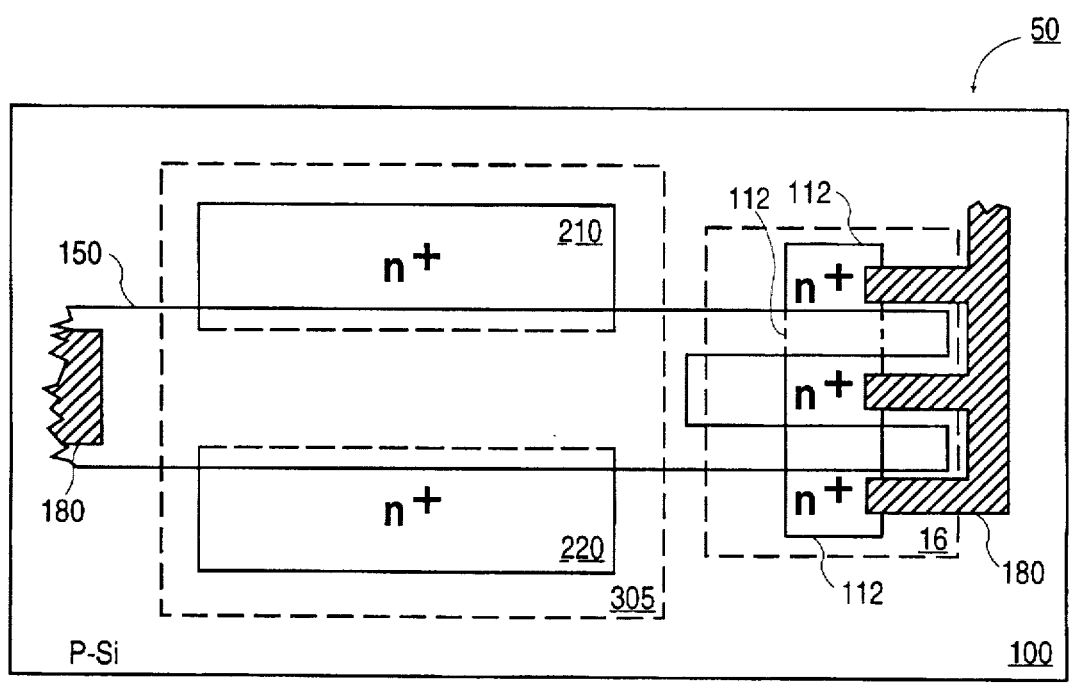
Figure 7A:
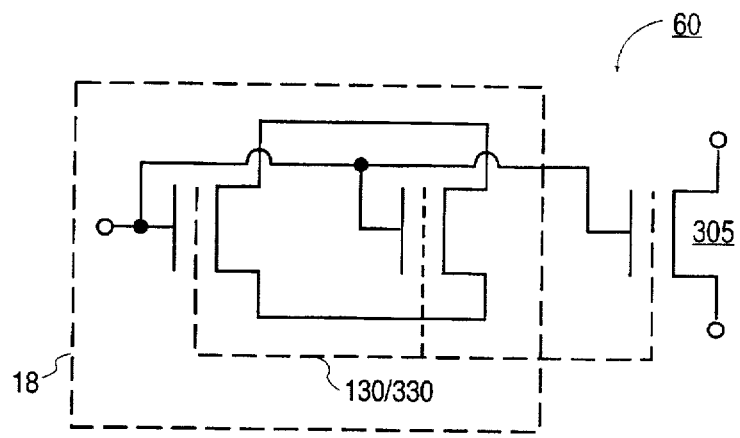
FIGS. 7A and 7B illustrate an embodiment of an erasable and programmable KFC.
Figure 7B:
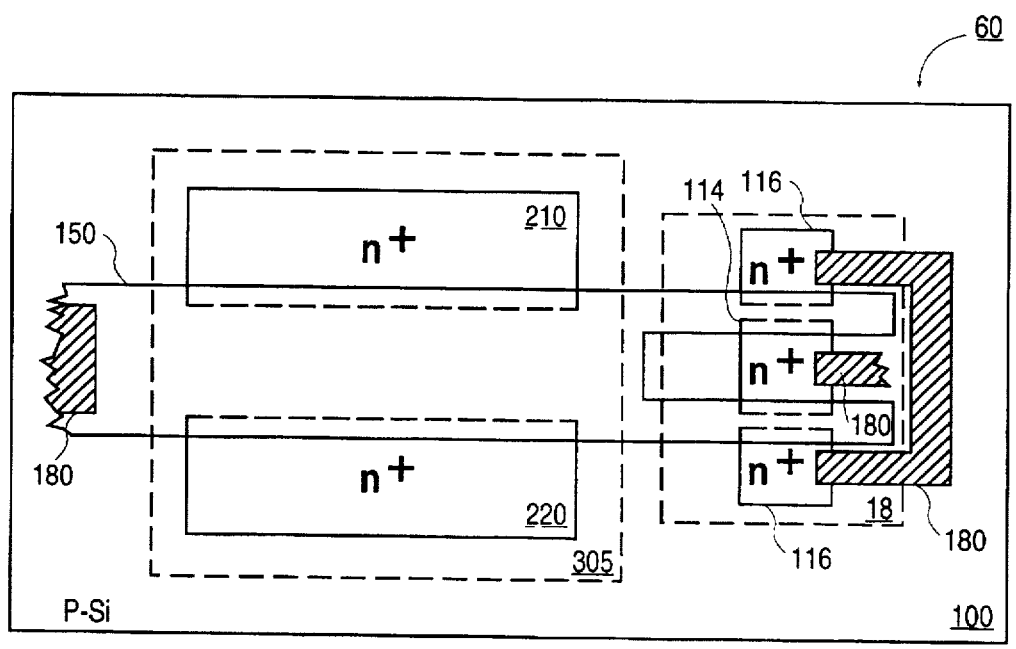

FIGS. 6A and 6B show alternative embodiments in which the controlling Flash cell is configured to produce particular program-erase characteristics in the KFC. FIGS. 6A and 6B show a KFC 50 which is erasable, but not programmable; that is, the threshold voltage can be lowered below its intrinsic value $V_{TK}$ to convert the K cell 305 into a depletion device, but it cannot practically be raised above the intrinsic value $V_{TK}$. The common gate 150 splits into two fingers in the Flash portion 16 of the KFC 50. The Flash portion 16 of the KFC 50 consists essentially of two Flash cells in parallel, where the $n^+$ lateral diffusions 112 have merged under the gate 150, such that the cell has a source 112 but no drain. This architecture prevents hot electron injection onto the floating gate 130/330. In addition, the absence of a junction under the gate 150 eliminates band-to-band tunneling, a phenomenon which can cause substantial source-to-substrate current during erasing. Consequently, a higher source voltage can be applied to the source 112 of the KFC 50 during erasing, giving the KFC 50 a shorter erase time than the standard KFC. Note that it is theoretically possible to program the KFC 50 through tunneling in the Flash cell 35, although the length of time required to perform such an operation would be prohibitive. Two Flash cells in parallel provide shorter erase time and improved reliability over a single Flash cell because of the increased tunneling area. It should be noted that the use of two Flash cells is arbitrary, however, and the number of Flash cells used can be varied to accommodate design requirements and manufacturing constraints. FIGS. 7A and 7B illustrate a KFC 60 having a Flash cell 18 which has two source diffusions 116 separate from a drain region 114 to allow both programming and erasing of the KFC 60.

As noted above, the present invention can be implemented with an M device in place of a K device to form an MFC. Alternatively, an O device may be substituted for a K device to form an OFC if a p-channel device is desired.

Therefore, what has been described is a stable, high-voltage tolerant MOSFET which has an electrically trimmable threshold voltage and which can be fabricated using existing Flash fabrication processes without requiring additional steps. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. An apparatus having an electrically trimmable threshold voltage, comprising:

control means for accepting an input voltage for varying stored charge;

switching means for switching current, the switching means having a threshold voltage corresponding to the stored charge; and storage means for storing the charge, wherein the storage means is shared by the control means and the switching means, such that varying the charge causes a corresponding change in the threshold voltage.

2. The apparatus of claim 1, wherein the storage means is formed from a contiguous layer of polysilicon.

3. The apparatus of claim 2, wherein the control means and the switching means are formed from a semiconductor layer, the control means further including a tunnel oxide layer between the semiconductor layer and the storage means, the switching means further including a gate oxide layer between the semiconductor layer and the storage means, the tunnel oxide layer having a first thickness such as to allow injection or tunneling of electrons through the tunnel oxide layer, the gate oxide layer having a second thickness such as to substantially inhibit injection or tunneling of electrons through the gate oxide layer.

4. The apparatus of claim 3, wherein the control means is a Flash cell.

5. An apparatus for electrically trimming a threshold voltage of a transistor, the apparatus comprising:

means for receiving an input voltage to vary a stored charge;

a transistor, the transistor having a threshold voltage; and means for storing the charge, wherein the means for storing the charge is physically part of both the means for receiving the input voltage and the transistor, such that a change in the charge causes a change in the threshold voltage.

6. The apparatus of claim 5, wherein the means for storing is a contiguous layer of polysilicon between two dielectric layers formed on a semiconductor layer.

7. The apparatus of claim 5, wherein the means for storing comprises two layers of polysilicon coupled together by a layer of metallization.

8. The apparatus of claim 5, wherein the transistor has physical characteristics such that the transistor is stable at drain voltages of approximately 12 volts.

9. A switching device having an electrically trimmable threshold voltage, comprising:
   a control transistor including a floating gate for storing charges wherein the control transistor is for receiving an input voltage to vary the charge; and
   a sensing transistor having a first threshold voltage, wherein the sensing transistor includes the floating gate, such that the floating gate is shared by the control transistor and the sensing transistor, such that varying the charges cause a change in the first threshold voltage.

10. The switching device of claim 9, wherein the floating gate is formed from a contiguous layer of polysilicon.

11. The switching device of claim 10, wherein the control transistor and the sensing transistor are formed on a semiconductor layer, wherein the control transistor has a tunnel oxide layer between the semiconductor layer and the floating gate, the sensing transistor has a gate oxide layer between the semiconductor layer and the floating gate, wherein the tunnel oxide layer has a first thickness such as to allow injection or tunneling of electrons through the tunnel oxide layer to program or erase the control transistor, respectively, and wherein the gate oxide layer has a second thickness such as to substantially inhibit injection or tunneling of electrons through the gate oxide layer.

12. The switching device of claim 11, wherein the control transistor has a second threshold voltage, and wherein the first threshold voltage and the second threshold voltage are lowered by inducing tunneling of electrons from the floating gate through the tunnel oxide layer to the semiconductor layer.

13. The switching device of claim 12, wherein the first threshold voltage and the second threshold voltage are increased by inducing injection of electrons from the semiconductor layer through the tunnel oxide layer to the floating gate.

14. The switching device of claim 11, wherein the sensing transistor is suitable for drain voltages of approximately twelve (12) volts.

15. The switching device of claim 9, wherein the control transistor comprises a Flash cell.

16. The switching device of claim 9, wherein the control transistor comprises an electrically erasable programmable read-only memory (EEPROM) cell.

17. The switching device of claim 9, wherein the control transistor and the sensing transistor further share a control gate formed over a dielectric layer, wherein the dielectric layer is formed over the floating gate.

18. A method of providing a high-voltage switching device having an electrically trimmable threshold voltage, comprising the steps of:

providing a semiconductor layer;

forming a first dielectric layer on the semiconductor layer, the first dielectric layer including a first region and a second region the first region corresponding to a gate region of a control device formed in the semiconductor layer, the second region corresponding to a gate region of a sensing device formed in the semiconductor layer, the control device having a first threshold voltage and the sensing device having a second threshold voltage, the gate region of the control device having a first thickness such as to allow injection and tunneling of electrons through the gate region of the control device, the gate region of the sensing device having a second thickness greater than the first thickness such as to substantially inhibit injection or tunneling of electrons through the gate region of the sensing device;

forming a first polysilicon layer on the first dielectric layer to create a single floating gate of both the control device and the sensing device, the floating gate for storing a charge;

forming a second dielectric layer on the first polysilicon layer; and forming a second polysilicon layer on the second dielectric layer to create a control gate for varying the charge on the floating gate, wherein varying the charge on the floating gate causes both a change in the first threshold voltage and a change in the second threshold voltage.

19. The method of claim 18, wherein the control device is a Flash cell.

20. A high-voltage transistor circuit providing electrically trimmable threshold voltages, comprising:
   a semiconductor layer;
   a first polysilicon layer forming a floating gate of both a flash cell and a sensing transistor formed in the semiconductor layer, the floating gate for storing a charge, the flash cell having a first threshold voltage and the sensing transistor having a second threshold voltage;
   a first dielectric layer formed between the semiconductor layer and the first polysilicon layer, the first dielectric layer including a first region and a second region, the first region of the first dielectric layer corresponding to a gate dielectric of the flash cell, the second region of the first dielectric layer corresponding to a gate dielectric of the sensing transistor, wherein the first region of the first dielectric layer has a first thickness such as to allow injection or tunneling of electrons, and wherein the second region of the first dielectric layer has a second thickness greater than the first thickness such as to substantially inhibit injection or tunneling of electrons;
   a second dielectric layer formed on the first polysilicon layer; and
   a second polysilicon layer forming a control gate of the flash cell and the sensing transistor formed on the second dielectric layer; wherein varying the charge on the floating gate causes a change in the first threshold voltage and a change in the second threshold voltage.

* * * * *